US008689070B2

(12) United States Patent
Huang et al.

(10) Patent No.: US 8,689,070 B2
(45) Date of Patent: Apr. 1, 2014

(54) METHOD AND SYSTEM FOR SCAN CHAIN DIAGNOSIS

(75) Inventors: Yu Huang, Sudbury, MA (US);
Wu-Tung Cheng, Lake Oswego, OR (US); Ruifeng Guo, Portland, OR (US);
Ting-Pu Tai, Taipei (TW)

(73) Assignee: Mentor Graphics Corporation, Wilsonville, OR (US)

( * ) Notice: Subject to any disclaimer, the term of this patent is extended or adjusted under 35 U.S.C. 154(b) by 501 days.

(21) Appl. No.: 12/781,695

(22) Filed: May 17, 2010

(65) Prior Publication Data

US 2010/0293422 A1 Nov. 18, 2010

Related U.S. Application Data

(60) Provisional application No. 61/179,011, filed on May 17, 2009.

(51) Int. Cl.
*G06F 11/00* (2006.01)

(52) U.S. Cl.
USPC .......................................... 714/741; 714/726

(58) Field of Classification Search
USPC ................................................ 714/726, 741
See application file for complete search history.

(56) References Cited

U.S. PATENT DOCUMENTS

| 4,630,270 | A | * | 12/1986 | Petit et al. ........................ 714/45 |
| 7,194,706 | B2 | * | 3/2007 | Adkisson et al. ............... 716/56 |
| 7,296,249 | B2 | * | 11/2007 | Rinderknecht et al. ........ 716/106 |
| 7,313,744 | B2 | * | 12/2007 | Huisman et al. ............... 714/726 |
| 2003/0188273 | A1 | * | 10/2003 | Kundu et al. ..................... 716/4 |
| 2006/0111873 | A1 | * | 5/2006 | Huang et al. ................... 702/185 |
| 2007/0168805 | A1 | * | 7/2007 | Huisman et al. ............... 714/726 |
| 2008/0250284 | A1 | * | 10/2008 | Guo et al. ....................... 714/726 |
| 2010/0306606 | A1 | * | 12/2010 | Huang et al. ................... 714/726 |

OTHER PUBLICATIONS

Morein, R.T.; Kalata, P.; , "A polynomial algorithm for noise identification in linear systems ," Intelligent Control, 1990. Proceedings., 5th IEEE International Symposium on , vol., No., pp. 595-600 vol. 1, Sep. 5-7, 1990.*
Yu Huang; , "Dynamic Learning Based Scan Chain Diagnosis," Design, Automation & Test in Europe Conference & Exhibition, 2007. Date '07 , vol., No., pp. 1-6, Apr. 16-20, 2007.*
K. De and A. Gunda, "Failure Analysis for Full-Scan Circuits", Proc. Int'l Test Conf., 1995, pp. 636-645.
S. Edirisooriya and G. Edirisooriya, "Diagnosis of Scan Path Failures," Proc. VLSI Test Symp., 1995, pp. 250-255.
R. Guo, and S. Venkataranman, "A Technique for Fault Diagnosis of Defects in Scan Chains," Proc. Int'l Test Conf., 2001, pp. 268-277.
J.-J. Hsu et al., "A New Robust Paradigm for Diagnosing Hold-Time Faults in Scan Chains," Proc. IEEE Int'l Symp. on VLSI Design, Automation and Test, 2006, pp. 171-174.

(Continued)

*Primary Examiner* — Steve Nguyen
(74) *Attorney, Agent, or Firm* — Klarquist Sparkman, LLP (57) ABSTRACT

Scan chain diagnosis techniques are disclosed. Faulty scan chains are modeled and scan patterns are masked to filter out loading-caused failures. By simulating the masked scan patterns, failing probabilities are determined for cells on a faulty scan chain. One or more defective cells are identified based upon the failing probability information. A noise filtering system such as the one based upon adaptive feedback may be adopted for the identification process.

26 Claims, 4 Drawing Sheets

(56) References Cited

OTHER PUBLICATIONS

Y. Huang et al., "Using Fault Model Relaxation to Diagnose Real Scan Chain Defects", Proc. Asia and South Pacific Design Automation Conf., 2005, pp. 1176-1179.

Y. Huang, "Dynamic Learning Based Scan Chain Diagnosis," Proc. Design, Automation & Test in Europe Conference & Exhibition, 2007, pp. 510-515.

J. Hwang et al., "Deterministic Localization and Analysis of Scan Hold-Time Faults", Proc. Int'l Symp. for Testing and Failure Analysis, 2008, pp. 396-401.

K. Khusyari et al., "Diagnosis of Voltage Dependent Scan Chain Failure Using VBUMP Scan Debug Method", Proc. Asian Test Symp., 2008, pp. 271.

S. Kundu, "On diagnosis of faults in a scan-chain," Proc. VLSI Test Symp., 1993, pp. 303-308.

J. Schafer et al., "Partner SRLs for Improved Shift Register Diagnostics," Proc. VLSI Test Symp., 1992, pp. 198-201.

P. Song et al., "A Novel Scan Chain Diagnostics Technique Based on Light Emission from Leakage Current," Proc. Int'l Test Conf., 2004, pp. 140-147.

F. Stellair et al., "Broken Scan Chain Diagnostics Based on Time-integrated and Time-Dependent Emission Measurements," Proc. Int'l Symp. for Testing and Failure Analysis, 2004, pp. 52-57.

X. Sun, "Adaptive Schemes for Noise Filtering and Edge Detection by Use of Local Statistics," IEEE Trans. on Circuit and Systems, vol. 35, No. 1, 1988, pp. 57-69.

C.-W. Tzeng et al., "A Robust Paradigm for Diagnosing Hold-Time Faults in Scan Chains," IET Proc. on Computers and Digital Techniques, vol. 1, No. 6, 2007, pp. 706-715.

Y. Wu, "Diagnosis of Scan Chain Failures," Proc. Int'l Symp. on Defect and Fault Tolerance in VLSI Systems, 1998, pp. 217-222.

J.-S. Yang and S.-Y. Huang, "Quick Scan Chain Diagnosis Using Signal Profiling," Proc. Int'l Conf. on Computer Design, 2005, pp. 157-160.

\* cited by examiner

METHOD AND SYSTEM FOR SCAN CHAIN DIAGNOSIS

RELATED APPLICATIONS

This application claims priority to U.S. Provisional Patent Application No. 61/179,011, entitled "Scan Chain Diagnosis By Adaptive Signal Profiling With Manufacturing ATPG Patterns," filed on May 17, 2009, and naming Yu Huang et al. as inventors, which application is incorporated entirely herein by reference.

FIELD OF THE INVENTION

The present invention is directed to scan chain diagnosis. Various aspects of the invention may be particularly useful for diagnosing scan chain failures caused by circuit defects.

BACKGROUND OF THE INVENTION

Overview

Scan-based testing has proven to be a cost-effective method to achieve good test coverage in digital circuits. The Achilles' heel for the application of scan-based testing is the integrity of the scan chains. Scan elements and clocking may occupy nearly 30% of a chip area. It has been reported that 10-30% defects can cause scan chains to fail and that chain failures account for almost 50% of chip failures. Scan chain diagnosis has thus become an important topic.

The scan chain diagnosis techniques may be classified into three main categories: tester-based, hardware-based, and software-based diagnosis techniques. Tester-based diagnosis techniques use a tester to control scan chain shift operations. Physical failure analysis (PFA) equipments are sometimes used together with a tester to observe defective responses at different locations and to identify a failing scan cell. These techniques normally provide very good diagnosis resolution. However, they are difficult to apply to chips with embedded compression circuits without resorting bypass mode. Hardware-based methods use specially-designed scan chains and scan cells to facilitate the diagnosis process. These methods are effective in isolating scan chain defects. However, the requirement of extra hardware, the specially-designed scan chains/cells, may not be acceptable in many realistic products. Software-based techniques use algorithmic diagnosis procedures to identify failing scan cells. It may run chain diagnosis with conventional scan chains with or without embedded compressions.

The current software-based chain diagnosis techniques may be further classified into two categories: (1) model-based and (2) data-driven algorithms. In model-based chain diagnosis, fault models and pattern simulation are used. In data-driven chain diagnosis, signal profiling, filtering and edge detections are applied. Each category of algorithms has its own advantages and disadvantages.

Terminologies

Normally, the patterns used in chain diagnosis can be classified into 3 categories: (1) A chain pattern is a pattern consisting of shift-in and shift-out without pulsing capture clocks and may be used to test the integrity of scan chains; (2) an ATPG scan pattern is a pattern consisting of shift-in, one or multiple capture clock cycles, and shift-out, and may be used to test system logic during manufacturing tests; and (3) a special chain diagnostic pattern is a pattern that is generated only for scan chain diagnosis purpose and may also include some special functional patterns.

To describe the diagnosis algorithms, typically each scan cell in a scan chain is given an index. Without losing generality, the cell connected to scan-output is numbered 0 and the cells in the chain are numbered incrementally from scan-output to scan-input. The scan cells between the scan chain input and the scan input terminal of a scan cell are called the "upstream cells" of the scan cell, while the scan cells between the scan chain output and the scan output terminal of a scan cell are called the "downstream cells" of the scan cell.

The scan chain fault models include stuck-at faults (stuck-at-0/stuck-at-1), slow faults (slow-to-rise/slow-to-fall/slow) and fast faults (fast-to-rise/fast-to-fall/fast). Slow faults are normally caused by setup-time violations while fast faults are normally caused by hold-time violations. With a specific fault model, a scan chain defect can also be modeled as a permanent fault (the fault happens for all shift cycles) or an intermittent fault (the fault only happens for a subset of shift cycles). Note that the defect itself is still permanent, but the fault model used to represent the defect is intermittent. An intermittent fault may be used to describe some characteristics for an un-modeled defect. For example, an intermittent stuck-at-0 fault refers to a defect that can cause some shift operations to fail as if a stuck-at-0 fault intermittently appears while which shift cycles may fail is not known.

The "noise" is defined as any discrepancy between the real defect behavior and the defect behavior given by a software-based diagnosis system. The sources of the noise include, but not limited to:
(1) discrepancy between a fault model and un-modeled realistic defects,
(2) defects that may impact both scan chains and the logic and/or clock systems,
(3) errors that are introduced into the failure log, during the failure log's generation/translation/ATE truncation processes,
(4) imperfectness/bugs of simulation procedures in EDA tools, and
(5) unrepeatable test results due to transient effects/testing environment changes.

Model-Based Chain Diagnosis

A model-based chain diagnosis method first identifies faulty scan chains and the corresponding fault models with chain patterns. Fault simulations are then performed. A fault is algorithmically "injected" to one scan cell on a faulty chain. The loaded values of the downstream cells are accordingly modified for all scan patterns. For example, suppose a scan pattern has good machine loaded value 001110011010 on the faulty chain. If a permanent stuck-at-1 fault is injected on scan cell 8 of this chain, the loaded values will be modified as 001111111111. After pulsing the capture clock, the simulated captured values in the upstream of the faulty scan cell on this chain will also be modified. For example if the simulated captured value is 101011101011, the unloaded values will be 111111101011. The fault simulation is performed one cell at a time. The simulation results are compared with the results observed on ATE (Automated Test Equipment). The cell(s) that matches the best are reported as suspect(s).

The advantages of the fault model and simulation based algorithm include (1) applicability of manufacturing ATPG scan patterns, (2) direct diagnosis without resorting to bypass mode in the case of embedded compression, and (3) good diagnosis resolution and accuracy when the defect can be modeled as permanent faults. The disadvantages include (1)

poor diagnosis resolution for intermittent faults and (2) disturbed diagnosis results if for some reason, some extra failing bits are introduced into the failure log or some failing bits are missing from the failure log.

Data-Driven Chain Diagnosis

A data-driven chain diagnosis method often uses special chain diagnosis patterns. These patterns could be either functional test patterns that start from an initial state, or scan patterns that start with all "0"s or all "1"s. The purpose of using such patterns is to avoid (or minimize) any faulty values introduced with the loading of scan chains. Therefore, all (or most) of the failing bits are caused in the process of unloading scan chains. Then the diagnosis can be performed by monitoring from which scan cell the signal probability has been significantly changed. These algorithms select patterns to randomize signal probability of scan cells before unloading. The failing scan cell position can be identified by comparing the observed signal profile on a tester and the expected signal profile.

The advantages of the data-driven algorithm include (1) good diagnosis accuracy even if the realistic defect's behavior is difficult to model because the method does not assume any specific fault model, (2) tolerance to "noises" existed in the failure log file, and (3) fast diagnosis speed because it does not rely on pattern simulations for each cell of a faulty scan chain. The disadvantages include: (1) Manufacturing ATPG scan patterns cannot be used because the faulty values during scan chain loading procedures could be propagated to the faulty chain itself which would compromise signal profiling results; and (2) it cannot apply to circuits with embedded compression logic without using bypass mode because it may have equal probability for any compressed expected value changing from "0" to "1" and from "1" to "0".

BRIEF SUMMARY OF THE INVENTION

Aspects of the invention relate to scan chain diagnosis techniques. With various implementations of the invention, one or more defective cells in a faulty scan chain may be identified. According to some embodiments of the invention, loading-caused failures are filtered out by masking scan patterns based on the faulty scan chain information. The masked scan patterns are then simulated to determine the failing probability information for each cell in a faulty scan chain. Based on the failing probability information, one or more defective cells in the faulty chain could be identified. An adaptive noise filtering system may be employed to help with the diagnosis process according to some embodiments of the invention.

DETAILED DESCRIPTION OF THE INVENTION

Various aspects of the present invention relate to techniques for identifying one or more defective cells in a faulty scan chain. In the following description, numerous details are set forth for purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or a networked computer.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" and "derive" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire microdevice, however, such as a portion of an integrated circuit device. Still further, the term "design" also is intended to encompass data describing more than one microdevice, such as data to be used to form multiple microdevices on a single wafer.

Operating Environment

Figure 1:
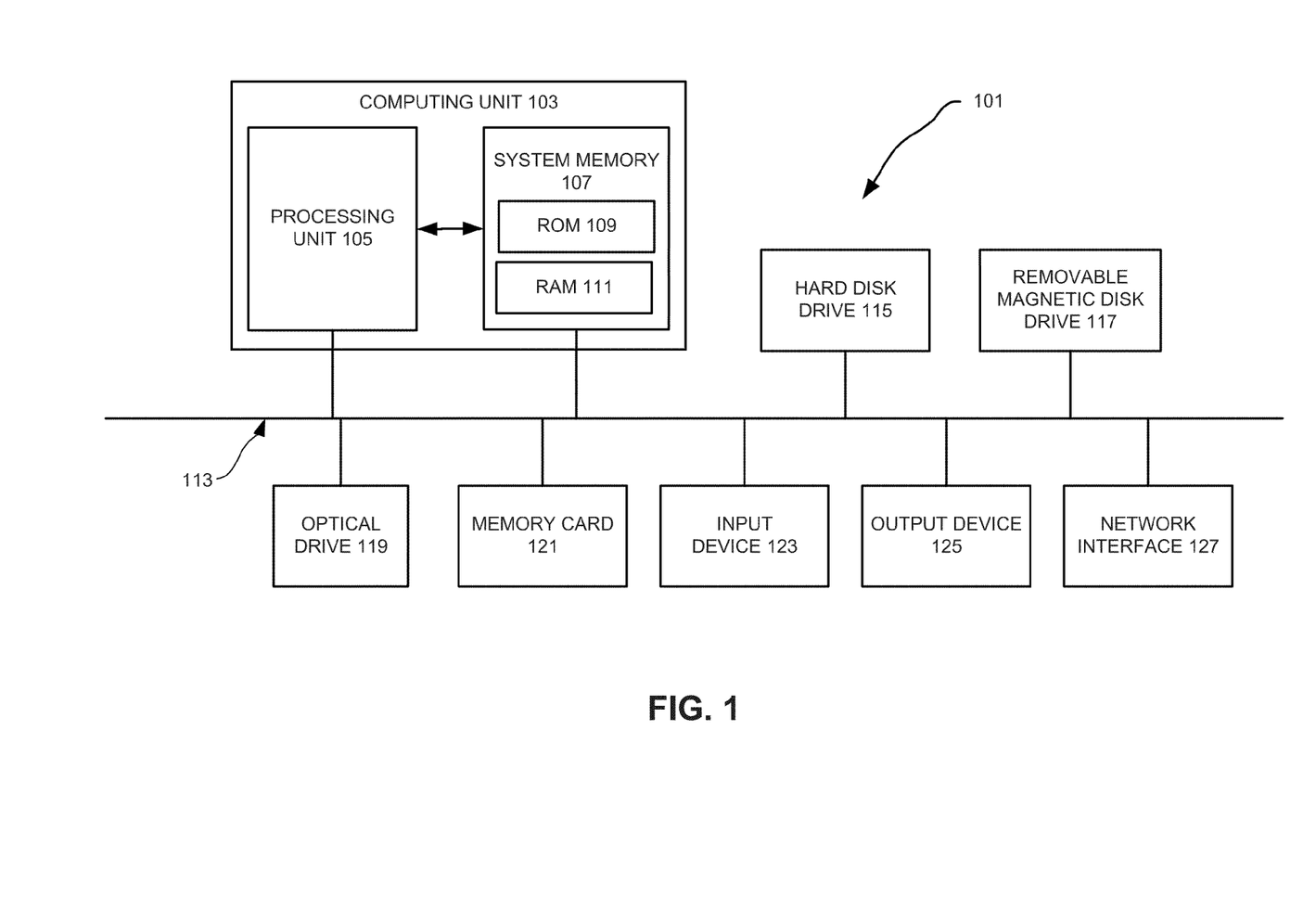
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Scan Chain Diagnosis

Figure 2:
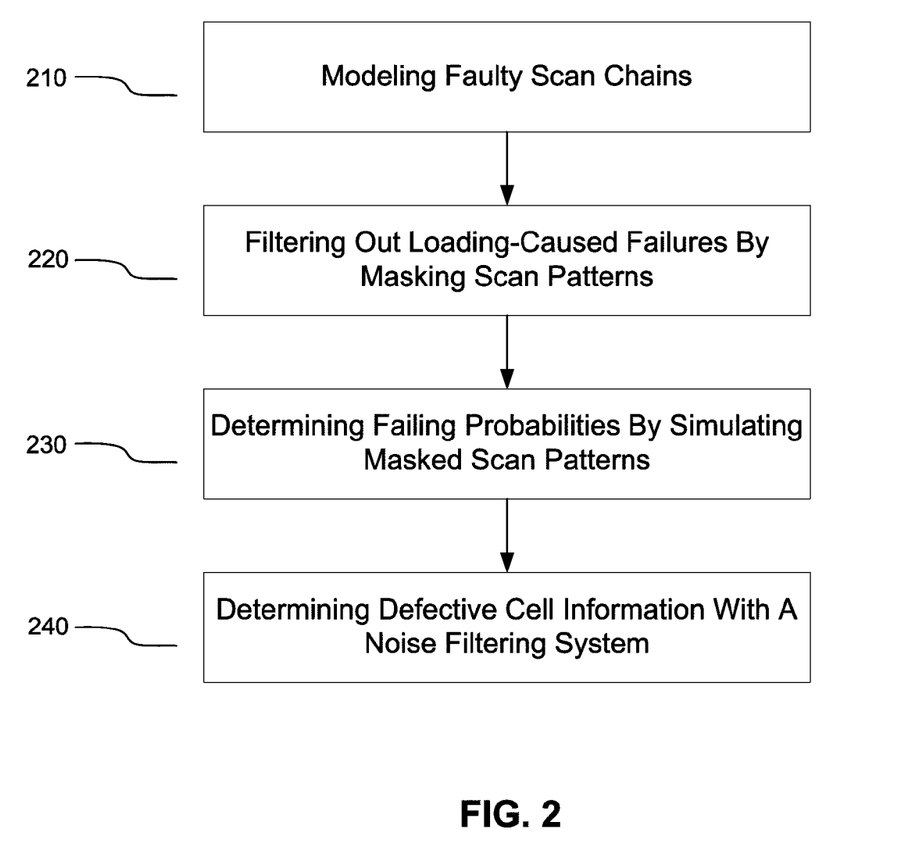
FIG. 2 illustrates a process for scan chain diagnosis in accordance with an embodiment of the present invention.

FIG. 2 illustrates various steps of scan chain diagnosis in accordance with some embodiments of the present invention. In step 210, the information of faulty chains and the corresponding fault models are received. The method of acquiring such information is similar to that used in the model-based chain diagnosis techniques. In step 220, loading-caused failures are filtering out by masking scan patterns. In step 230, the failing probability information is determined by simulation and statistics. In step 240, the defective cell location is determined based on the failing probability information. In many cases, noises may prevent defective cell(s) from being identified. A noise filtering system such as the adaptive type could be adopted to solve the problem.

With some implementations of the invention, chain patterns are used to identify faulty chains and the corresponding fault models. Table 1 illustrates the process. Suppose a faulty scan chain with 12 scan cells is loaded with a chain pattern 001100110011, where the leftmost bit is loaded into Cell 11 and the rightmost bit is loaded into Cell 0. Column 2 gives the unloaded faulty values for each type of permanent faults. Column 3 gives examples of the unloaded faulty values for each type of intermittent faults. The underlined values show the difference between the expected unloaded values and the observed values. By looking up this table, one can identify the chain fault model associated with the faulty scan chain. Table 1 is just an example. Other types of fault models may also be included in the table.

TABLE 1

Scan Chain Fault Models and Their Effects (Fault-Free Unloaded Value: 001100110011)

| Fault Models | Unloaded Values with One Permanent Faults | Unloaded Values with One Intermittent Fault (Examples) |
| --- | --- | --- |
| Slow-to-Rise | 00100010001X | 00110010001X |
| Slow-to-Fall | 01110111011X | 01110011011X |
| Slow | 01100110011X | 00100111011X |
| Fast-to-Rise | X01110111011 | X01110110011 |
| Fast-to-Fall | X00100010001 | X00100110001 |
| Fast | X00110011001 | X00100111001 |
| Stuck-at-0 | 000000000000 | 001000010000 |
| Stuck-at-1 | 111111111111 | 101111111011 |

In some embodiments of the invention, an X-masking technique is employed to mask loading-caused failures. The technique identifies all the sensitive bits in the loading values for each scan pattern and replaces each of them with an "X". The sensitive bits are the cell values that may be changed during scan chain shift operations. For different fault models, the sensitive bits are different. For example, suppose a scan pattern has a good machine loaded value 001110011010 on the faulty chain. If a stuck-at-1 fault is identified, all "0"s will become sensitive bits, and the loaded value will be modified as XX111XX11X1X. If a fast-to-rise fault is identified instead, all "0"s within the "10" transitions will become sensitive bits, and the loaded value will be changed to "00111X011X1X".

The X-masked scan patterns are simulated to derive the failing probability information. For circuits without embedded compactors, two parameters, Sen(i) and Fail(i), are determined for each cell on the faulty chain. Sen(i) is the number of scan patterns that capture a sensitive bit on cell i on the faulty chain. Fail(i) is the times that cell i failed on ATE when scan patterns capture a sensitive bit on cell i. For circuits with embedded compactors, two parameters, Sen(i) and Fail(i), may be determined for each cycle on the compacted faulty channel. Sen(i) is the number of scan patterns that capture a sensitive bit on cell i on the faulty chain and have a binary value at cycle i on the faulty channel after compaction. Fail(i) is the times that circle i fails on ATE after compaction among Sen(i). Here, compactors can be any types of compactors.

Figure 3:
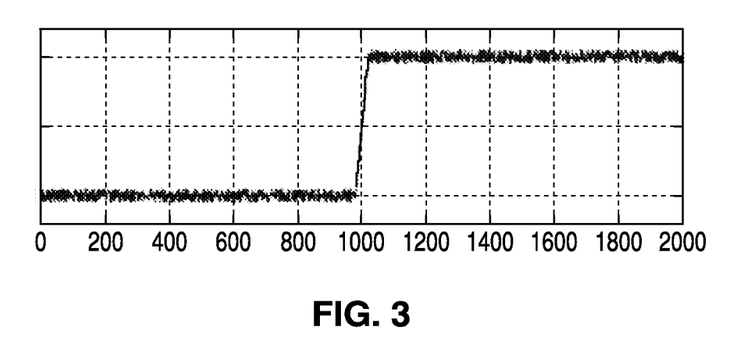
FIG. 3 illustrates an example of $P_{fail}(i)$ with very low noises.

In some embodiments of the invention, a failing probability, $P_{fail}(i)$ is calculated for the identification of failing scan cell(s). When Sen(i) is not 0, $P_{fail}(i)$=Fail(i)/Sen(i). When Sen(i) is 0, $P_{fail}(i)$ will be interpolated based on the value of $P_{fail}(i-1)$ and $P_{fail}(i+1)$. In an ideal situation, a drastic change of $P_{fail}$ between the downstream and upstream cells of the defective cell is expected. For example, if a defect can be modeled with a permanent fault and the defect is at cell i on a chain with N scan cells, $P_{fail}(0), P_{fail}(1), \ldots P_{fail}(i-1)$ should be all 0, while $P_{fail}(i), P_{fail}(i+1), \ldots P_{fail}(N-1)$ should be all 100%. FIG. 3 shows a diagram that is close to the ideal situation.

A differential failing probability, denoted as $\text{Diff}_{fail}(i)=|P_{fail}(i)-P_{fail}(i-1)|$, may also be employed to determine the defective cell location. In the above example, the defective cell location may be easily identified by finding the maximum $\text{Diff}_{fail}(i)$ at cell i such that the $P_{fail}$ jumps from 0 at cell (i−1) to 100% at cell (i).

Figure 4:
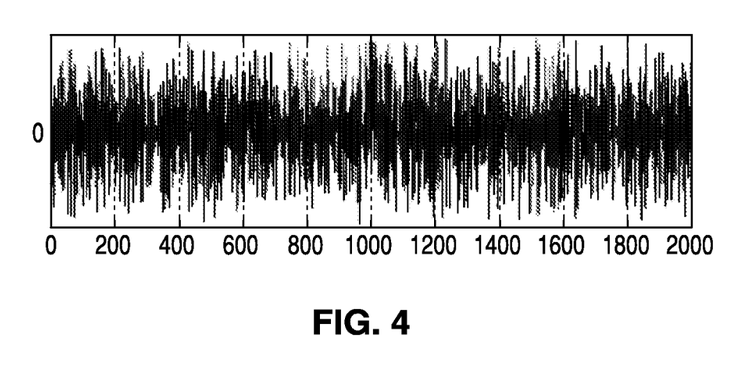
FIG. 4 illustrates an example of $P_{fail}(i)$ with very high noises.

However, this is not happening for many practical diagnosis cases. FIG. 4 depicts such an example where no clear and drastic change in $P_{fail}$ could be identified. One major reason for this is that some realistic chain defects cannot be modeled by permanent fault models, but instead by intermittent fault models. This can make $P_{fail}$ to be less than 100%. Many other sources can also contribute to noises, as discussed in the Section of Terminologies.

Figure 5:
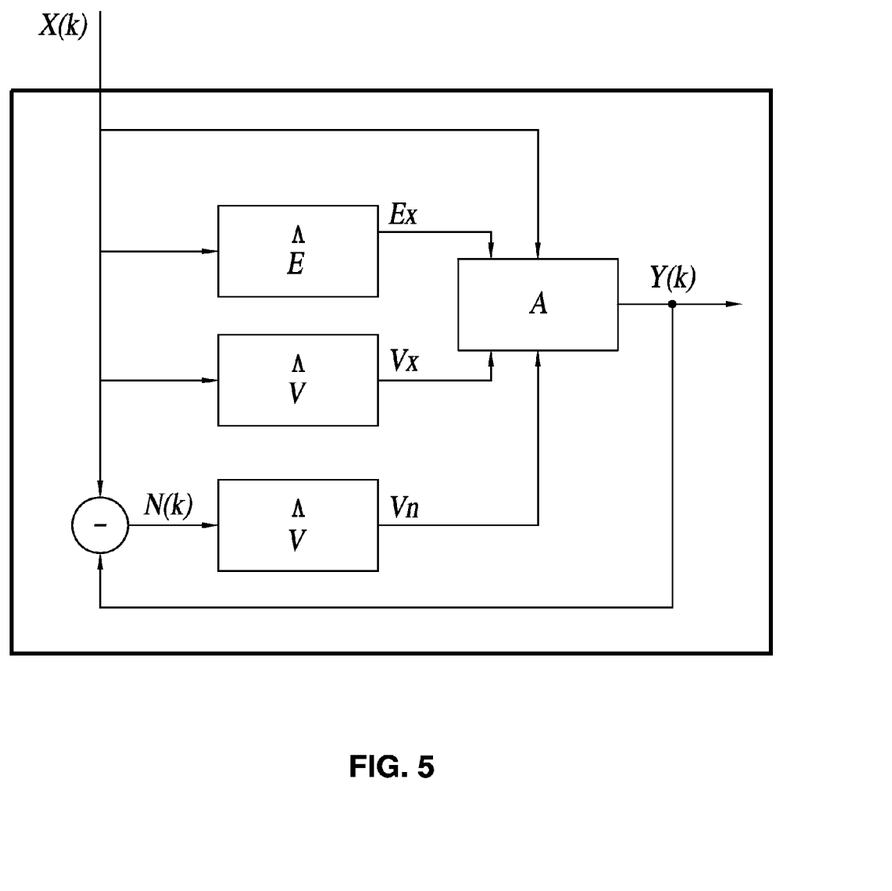
FIG. 5 illustrates a structural diagram of an adaptive noise filtering system.

A noise filtering system may be employed to recover to some extent "pure signal" (ideal $Diff_{fail}$) out of the context of "signal+noise" (calculated $Diff_{fail}$ based on failure log). An adaptive noise filtering system is illustrated in FIG. 5. It has one input $X(k)$ $k=0, 1, \ldots N-1$. In the present invention, $X(k)$ is the $Diff_{fail}$ for cell k calculated from the above steps. Assume $X(k)=S(k)+N(k)$, where $S(k)$ is the pure signal, and $N(k)$ is the noise. The output $Y(k)$ is the optimal estimate of $S(k)$ in the sense of MMSE (Minimum Mean Square Estimation). Here, $Y(k)$ is used to estimate the ideal $Diff_{fail}$ for cell k. The whole system is composed with three operators:

(1) Expectation operator $\hat{E}$ is used to get the signal and noise expectations over a moving signal window with size T, and a noise window of size M, respectively.

$$\hat{E}x = \frac{1}{T}\sum_{i=1}^{T} x(i), \quad \hat{E}n = \frac{1}{M}\sum_{i=1}^{M} n(i);$$

(2) Derivation operator $\hat{V}$ is used to obtain the derivation estimates of the signal and noise, over a moving signal window with size T and a noise window of size M, respectively.

$$\hat{V}x = \frac{1}{T}\sum_{i=1}^{T} \left[x(i) - \hat{E}x\right]^2, \quad \hat{V}n = \frac{1}{M}\sum_{i=1}^{M} \left[\hat{n}(i) - \hat{E}n\right]^2$$

For each scan cell k ($k > \text{Max}((T-1), (M-1))$), the signal window is chosen to include cells $k-T+1, k-T+2, \ldots, k$, and the noise window is chosen to include cells $k-M, k-M+1, \ldots, k-1$. The noise window is one cell delayed with respect to the signal window because at cell k, only signals from cell 0 to cell k–1 are available. For scan cells 0, 1, … T–1, the equations cannot be used since the signal window size is T. So original calculated $Diff_{fail}$ are used as the estimated ideal $Diff_{fail}$ at these boundary T cells. Normally T and M are small number.

(3) Adaptive operator A is used to calculate $Y(k)$. As explained in [SUN88], the adaptive system will feed the estimated output back to the input and use the difference as a noise estimator. Since the real noise is not modeled, the estimated noise adaptively calculated from previous cells will be used as the estimated noise at the current cell.

$$Y(k) = (1-a)X(k) + a\hat{E}x, \text{ where}$$

$$a = b + \frac{\hat{V}n}{\hat{V}x}, \text{ if } b + \frac{\hat{V}n}{\hat{V}x} \leq 1, \quad a = 1, \text{ if } b + \frac{\hat{V}n}{\hat{V}x} > 1$$

The larger b is the better filter effect will be, but it will blur the sharp edges. Hence a small number is normally chosen for b. The parameters T, M, b should be tuned based on experiments and data-driven statistics.

After the adaptive feedback system is set up, the ideal $Diff_{fail}$ is determined based on the calculated $Diff_{fail}$ with the hope to filter out various noise introduced into the failure log file. The top one or several cells with the largest ideal $Diff_{fail}$ may be reported as suspect(s).

Alternative Implementations

While specific implementations of a scan chain diagnosis process according to various embodiments of the invention have been described, it should be appreciated that other embodiments of the invention may encompass a number of alternative implementations. For example, while manufacturing ATPG scan patterns are preferred for diagnosis, some implementations of the invention may utilize special chain diagnosis patterns. Especially when the diagnosis results with manufacturing ATPG scan patterns are not satisfactory, additional special chain diagnosis patterns may be applied. Still further, while specific implementations of the invention have been described to explain the use of the adaptive noise filtering system for noise reduction, some embodiments of the invention may employ other noise filtering systems.

What is claimed is:

1. A method of scan chain diagnosis, executed by at least one processor of a computer, comprising:
   receiving faulty scan chain information of an integrated circuit, the faulty scan chain information including information identifying one or more faulty scan chains and fault models associated with the one or more faulty scan chains;
   masking scan patterns based on the faulty scan chain information to filter out loading-caused failures, the scan patterns being applied to the integrated circuit, wherein masking scan patterns comprises X-masking sensitive bits in the scan patterns;
   simulating the masked scan patterns to determine failing probability information for cells on one of the one or more faulty scan chains, wherein simulating the masked scan patterns includes simulating the X-masked scan patterns to obtain sensitive bit capture counts and failing bit counts for the cells, and calculating failing probabilities for identification of the one or more faulty scan chains based upon the sensitive bit capture counts and the failing bit count counts; and
   determining defective cell information based on the failing probability information.

2. The method recited in claim 1, wherein the faulty scan chain information is determined by applying chain patterns to the integrated circuit.

3. The method recited in claim 1, wherein the scan patterns include ATPG scan patterns.

4. The method recited in claim 1, wherein the scan patterns include chain diagnosis patterns.

5. The method recited in claim 1, wherein the failing probabilities include a ratio for each of the cells for which the sensitive bit capture count is not zero, the ratio being calculated by dividing the failing bit count by the sensitive bit capture count for the each of the cells.

6. The method recited in claim 1, wherein the failing probabilities include a ratio for each of the cells for which the sensitive bit capture count is not zero, the ratio being calculated by dividing the failing bit count by the sensitive bit capture count for the each of the cells; and a value by interpolation for each of the cells derived for which the sensitive bit capture count is zero.

7. The method recited in claim 1, wherein simulating the masked scan patterns to determine failing probability information for cells on one of the one or more faulty scan chains further comprises calculating a differential failing probability for each of the cells except the cell with the lowest index number.

8. The method recited in claim 1, wherein determining defective cell information comprises filtering noises existed in the failing probability information with a noise filtering system.

9. The method recited in claim 1, wherein determining defective cell information comprises filtering noises existed in the failing probability information with a noise filtering system.

10. The method recited in claim 9, wherein the noise filtering system is an adaptive noise filtering system.

11. A non-transitory processor-readable medium storing processor-executable instructions for causing one or more processors to perform a method of scan chain diagnosis, the method comprising:
   receiving faulty scan chain information of an integrated circuit, the faulty scan chain information including information identifying one or more faulty scan chains and fault models associated with the one or more faulty scan chains;
   masking scan patterns based on the faulty scan chain information to filter out loading-caused failures, the scan patterns being applied to the integrated circuit, wherein masking scan patterns comprises X-masking sensitive bits in the scan patterns;
   simulating the masked scan patterns to determine failing probability information for cells on one of the one or more faulty scan chains, wherein simulating the masked scan patterns includes obtaining sensitive bit capture counts and failing bit counts for the cells, and determining failing probability includes calculating failing probabilities based upon the sensitive bit capture counts and the failing bit counts; and
   determining defective cell information based on the failing probability information.

12. The non-transitory processor-readable medium recited in claim 11, wherein the faulty scan chain information is determined by applying chain patterns to the integrated circuit.

13. The non-transitory processor-readable medium recited in claim 11, wherein the failing probabilities include a ratio for each of the cells for which the sensitive bit capture count is not zero, the ratio being calculated by dividing the failing bit count by the sensitive bit capture count for the each of the cells.

14. The non-transitory processor-readable medium recited in claim 11, wherein the failing probabilities include a ratio for each of the cells for which the sensitive bit capture count is not zero, the ratio being calculated by dividing the failing bit count by the sensitive bit capture count for the each of the cells; and a value by interpolation for each of the cells derived for which the sensitive bit capture count is zero.

15. The non-transitory processor-readable medium recited in claim 11, wherein simulating the masked scan patterns to determine failing probability information for cells on one of the one or more faulty scan chains further comprises calculating a differential failing probability for each of the cells except the cell with the lowest index number.

16. The non-transitory processor-readable medium recited in claim 11, wherein determining defective cell information comprises filtering noises existed in the failing probability information with a noise filtering system.

17. The non-transitory processor-readable medium recited in claim 11, wherein determining defective cell information comprises filtering noises existed in the failing probability information with a noise filtering system.

18. The non-transitory processor-readable medium recited in claim 17, wherein the noise filtering system is an adaptive noise filtering system.

19. A system comprising one or more processors, the one or more processors programmed to perform a method of scan chain diagnosis, the method comprising:
   receiving faulty scan chain information of an integrated circuit, the faulty scan chain information including information identifying one or more faulty scan chains and fault models associated with the one or more faulty scan chains;
   X-masking scan patterns based on the faulty scan chain information to filter out loading-caused failures, the scan patterns being applied to the integrated circuit, wherein X-masking scan patterns comprises X-masking sensitive bits in the scan patterns;
   simulating the X-masked scan patterns to determine failing probability information for cells on one of the one or more faulty scan chains, wherein simulating the X-masked scan patterns includes obtaining sensitive hit capture counts and failing bit counts for the cells, and determining failing probability includes calculating failing probabilities based upon the sensitive bit capture counts and the failing bit counts; and
   determining defective cell information based on the failing probability information.

20. The system recited in claim 19, wherein the faulty scan chain information is generated by applying chain patterns to the integrated circuit.

21. The system recited in claim 19, wherein the failing probabilities include a ratio for each of the cells for which the sensitive bit capture count is not zero, the ratio being calculated by dividing the failing bit count by the sensitive bit capture count for the each of the cells.

22. The system recited in claim 19, wherein the failing probabilities include a ratio for each of the cells for which the sensitive bit capture count is not zero, the ratio being calculated by dividing the failing bit count by the sensitive bit capture count for the each of the cells; and a value by interpolation for each of the cells derived for which the sensitive bit capture count for the each of the cells is zero.

23. The system recited in claim 19, wherein simulating the masked scan patterns to determine failing probability information for cells on one of the one or more faulty scan chains further comprises calculating a differential failing probability for each of the cells except the cell with the lowest index number.

24. The system recited in claim 19, wherein determining defective cell information comprises filtering noises existed in the failing probability information with a noise filtering system.

25. The system recited in claim 19, wherein determining defective cell information comprises filtering noises existed in the failing probability information with a noise filtering system.

26. The system recited in claim 25, wherein the noise filtering system is an adaptive noise filtering system.

* * * * *